(12) United States Patent
Abraham et al.

(10) Patent No.: US 12,324,361 B2
(45) Date of Patent: Jun. 3, 2025

(54) ELECTRICAL CONNECTIONS BETWEEN DISSIMILAR MATERIALS AT CRYOGENIC TEMPERATURES

(71) Applicant: INTERNATIONAL BUSINESS MACHINES CORPORATION, Armonk, NY (US)

(72) Inventors: David Abraham, Croton, NY (US); John Michael Cotte, New Fairfield, CT (US); Nicholas A. Masluk, Putnam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 179 days.

(21) Appl. No.: 17/861,151

(22) Filed: Jul. 8, 2022

(65) Prior Publication Data

US 2023/0363294 A1    Nov. 9, 2023

Related U.S. Application Data

(60) Provisional application No. 63/339,922, filed on May 9, 2022.

(51) Int. Cl.
*H10N 60/81* (2023.01)
*G06N 10/40* (2022.01)
*H10N 60/01* (2023.01)

(52) U.S. Cl.
CPC ............ *H10N 60/81* (2023.02); *G06N 10/40* (2022.01); *H10N 60/01* (2023.02)

(58) Field of Classification Search
CPC ........ H10N 60/81; H10N 60/01; H10N 69/00; G06N 10/40

USPC ........................................................ 257/778
See application file for complete search history.

(56) References Cited

U.S. PATENT DOCUMENTS

| | | |
|---|---|---|
| 6,221,682 B1 | 4/2001 | Danziger et al. |
| 7,057,292 B1 | 6/2006 | Elenius et al. |
| 7,543,377 B2 | 6/2009 | Barrow |
| 7,564,130 B1 | 7/2009 | Li |
| 7,823,278 B2 | 11/2010 | Hougham et al. |
| 8,575,493 B1 | 11/2013 | Xu et al. |
| 8,686,560 B2 | 4/2014 | Parvarandeh et al. |

(Continued)

FOREIGN PATENT DOCUMENTS

| | | |
|---|---|---|
| CN | 109997156 A | 7/2019 |
| CN | 113366513 A | 9/2021 |

(Continued)

OTHER PUBLICATIONS

List of IBM Patents or Patent Applications Treated as Related, 2 pgs.

(Continued)

*Primary Examiner* — Caleen O Sullivan
(74) *Attorney, Agent, or Firm* — Intelletek Law Group, PLLC; Gabriel Daniel, Esq.

(57) ABSTRACT

A cryogenic electronics device includes a semiconductor chip. A substrate is flip-chip bonded to the semiconductor chip. A plurality of bump bonds are concentrated in a bump region of the semiconductor chip. A plurality of circuit elements are arranged in a predefined region of the semiconductor chip. The predefined region and the bump region are separate regions.

20 Claims, 4 Drawing Sheets

(56) References Cited

U.S. PATENT DOCUMENTS

| | | | |
|---|---|---|---|
| 8,710,656 | B2 | 4/2014 | Daubenspeck et al. |
| 9,093,333 | B1 | 7/2015 | Xu et al. |
| 9,099,318 | B2 | 8/2015 | Chen |
| 9,379,303 | B2 | 6/2016 | Gambetta et al. |
| 9,818,679 | B2 | 11/2017 | Baba et al. |
| 9,971,970 | B1 | 5/2018 | Rigetti et al. |
| 10,056,345 | B2 | 8/2018 | Kuo et al. |
| 10,355,193 | B2 | 7/2019 | Rosenblatt et al. |
| 10,381,541 | B2 | 8/2019 | Das et al. |
| 10,396,269 | B2 | 8/2019 | Oliver et al. |
| 10,403,591 | B2 | 9/2019 | Gandhi |
| 10,692,831 | B1 | 6/2020 | Bronn et al. |
| 10,692,924 | B2 | 6/2020 | Dzurak et al. |
| 10,734,696 | B2 | 8/2020 | El Bouayadi et al. |
| 10,769,546 | B1 | 9/2020 | Rigetti et al. |
| 10,804,233 | B1 | 10/2020 | Khandekar |
| 10,984,335 | B1 | 4/2021 | Bronn et al. |
| 11,139,282 | B2 | 10/2021 | Ting |
| 11,171,104 | B2 | 11/2021 | Nayini et al. |
| 11,195,773 | B2 | 12/2021 | Nah et al. |
| 11,205,035 | B1 | 12/2021 | Shao et al. |
| 2011/0235296 | A1 | 9/2011 | Shi et al. |
| 2014/0042615 | A1 | 2/2014 | Huang et al. |
| 2018/0342476 | A1 | 11/2018 | Wirz |
| 2019/0131265 | A1 | 5/2019 | Gandhi |
| 2019/0181256 | A1 | 6/2019 | Roberts |
| 2019/0273197 | A1* | 9/2019 | Roberts ............. G06N 10/00 |
| 2020/0176409 | A1* | 6/2020 | Lucero ............. H01L 24/81 |
| 2020/0258003 | A1 | 8/2020 | Rigetti |
| 2020/0401924 | A1 | 12/2020 | Paik et al. |
| 2021/0305958 | A1 | 9/2021 | Hassel |
| 2021/0407939 | A1 | 12/2021 | Sun et al. |
| 2022/0020715 | A1 | 1/2022 | Lewandowski |

FOREIGN PATENT DOCUMENTS

| | | |
|---|---|---|
| CN | 215729852 U | 2/2022 |
| GB | 2062963 A | 5/1981 |
| JP | 2021072351 A | 5/2021 |
| TW | 201931543 A | 8/2019 |
| TW | 1713170 B | 12/2020 |
| TW | 202205159 A | 2/2022 |
| WO | 2020/263018 A1 | 12/2020 |

OTHER PUBLICATIONS

International Search Report and Written Opinion issued Aug. 8, 2023 in related International Patent Application No. PCT/IB2023/054690, 12 pgs.

International Search Report and Written Opinion issued Jul. 27, 2023 in related application No. PCT/IB2023/054686, 14 pgs.

International Search Report and Written Opinion issued Aug. 1, 2023 in related application No. PCT/IB2023/054688, 13 pgs.

Gold, A. et al., "Entanglement Across Separate Silicon Dies in a Modular Superconducting Qubit Device"; NPJ Quantum Information, 2021, 10 pgs, vol. 7, Issue No. 142.

Hillman Craig. "The Benefits and Risks of Copper Pillar Bumped Flip Chips." U.S. Tech, Mar. 2017.3 pages.

Leung, N. et al., "Deterministic Bidirectional Communication and Remote Entanglement Generation Between Superconducting Qubits"; NPJ Quantum Information, 2019, 5 pgs, vol. 5, Issue No. 18.

Li et al., "Vacuum-Gap Transmon Qubits Realized Using Flip-Chip Technology," Applied Physics Letters, Nov. 3, 2021, 184003 (9 pages), vol. 119, Issue No. 18.

O'Brien W et al: "Superconducting Caps for Quantum Integrated Circuits", arXiv:1708.02219v1 [physics.app-ph], © Copyright 2017 Rigetti & Co, Inc., Aug. 7, 2017, 4 pages.

Schoelkopf, R. "Toward Robust, Modular Quantum Computing with Hardware Efficient Error Correction 4th International Conference on Quantum Error Correction", Sep. 1-15, 2017 by Georgia Tech and the Joint Center for Quantum Information and Computer Science at the University of Maryland, Sep. 1-15, 2017, 23 pages. available at: https://www.youtube.com/watch?v=hH0vkz1qa9Y&ab_channel=QuICS; Transcription.

United States Non-Final Rejection dated Jan. 18, 2024, 10 pages, in U.S. Appl. No. 17/871,887.

United States Notice of Allowance dated Aug. 13, 2024, 6 pages, in U.S. Appl. No. 17/871,887.

United States Notice of Allowance dated May 22, 2024, 9 pages, in U.S. Appl. No. 17/871,887.

United States Notice of Allowance dated Oct. 11, 2024, 6 pages, in U.S. Appl. No. 17/871,887.

United States Notice of Allowance dated Sep. 6, 2024, 5 pages, in U.S. Appl. No. 17/871,887.

United States Requirement for Restriction/Election dated Sep. 13, 2023, 7 pages, in U.S. Appl. No. 17/871,887.

* cited by examiner

ELECTRICAL CONNECTIONS BETWEEN DISSIMILAR MATERIALS AT CRYOGENIC TEMPERATURES

BACKGROUND

Technical Field

The present disclosure generally relates to cryogenic electronic devices, and more particularly, to a method of a bonding a chip to a substrate that can operate in cryogenic or sub-cryogenic temperatures.

Description of the Related Art

Flip-chip bonding is often used in electrical devices which are intended to be used at low temperatures. Bump bonds are often used on the periphery of a chip, or across the entire chip, to allow signals to escape. In the case where the chip is bonded to a PCB or laminate material, the difference in thermal expansion of the two materials can limit the viable size of the chip that can be used without thermal expansion causing the chip to pull away from the bonded substrate.

SUMMARY

According to one embodiment, a cryogenic electronics device includes a semiconductor chip flip-chip bonded to a substrate. A plurality of bump bonds are concentrated in a bump region of the semiconductor chip. A plurality of circuit elements is concentrated in a predefined region of the semiconductor chip, wherein the predefined region and the bump region are separate regions. This construction prevents and/or reduces damage to the bonds caused by different coefficients of thermal expansion of the semiconductor chip and the substrate.

According to an embodiment, the plurality of circuit elements include qubits, and the semiconductor chip is a silicon chip.

According to an embodiment, one or more standoffs are arranged in a region of the semiconductor chip away from the bump region. The standoffs provide mechanical stability to the structure due to the concentration of the bumps in the bump region.

According to an embodiment, the one or more standoffs separates the semiconductor chip and the substrate. The standoffs provide mechanical stability to the semiconductor chip and the substrate.

According to an embodiment, the bump region is substantially circular. The substantially circular arrangement provides an advantage in the number of bumped connections that can be included in the structure without subjecting the combined chip and substrate to excessive damage due to mismatch of thermomechanical properties of each.

According to one embodiment, a cryogenic electronics device includes a first substrate and a second substrate joined to the first substrate. A plurality of bump bonds are concentrated in a contiguous bump region of the first substrate, and a plurality of circuit elements are arranged in a predefined region of the first substrate that is separate from the bump region. The construction prevents and/or reduce damage to the bonds caused by different coefficients of thermal expansion of the semiconductor chip and the substrate.

In one embodiment, the bump region includes a plurality of substrates and the predefined region are not located between any portion of the bump region. This structure permits signals from the bumps to be exported to the exterior of the structure.

In one embodiment, the circuit elements include a plurality of qubits, and the plurality of bump bonds in the bump region of the first substrate is configured to provide a signal to the plurality of qubits. There may be less interference by this arrangement.

In one embodiment, the bump region is an area of the first substrate that includes bump bonds and signal lines. A more concentrated bump region permits the inclusion of more qubits in the device.

In one embodiment, the bump region is area of the first substrate that excludes the plurality of qubits. The separation of the predefined region from the bump region provides for a more efficient structure that permits the inclusion of more qubits.

In one embodiment, the bump region is an area of the first substrate that excludes circuit elements. A differently-sized bump region that excludes other circuit elements can permit more qubits to be arranged in the device.

In one embodiment, a numerical design criterion includes at least one of: greater than a number (n) of bumps arranged in an area less than x; or, a density of at least n bumps/area.

According to an embodiment, a thermal contraction of the bump region is defined as a relative value including at least one of: the thermal contraction of the bump region experiences less than a percentage x of a thermal contraction of the first substrate; the thermal contraction of the bump region experiences less thermal contraction than a different predefined region; the thermal contraction of the bump region has a predetermined expansion between the first substrate and the second substrate; and/or the bumps are arranged to be within a percentage of a minimum coefficient of thermal expansion mismatch for a thermal excursion from room temperature to a base temperature.

In one embodiment, the device further includes a plurality of substrate connectors. Each substrate connector is respectively connected to one portion of the bump region. At least some nodes of the substrate connectors are wired to the first substrate. More qubits can be arranged on the structure with the plurality of bump regions.

According to one embodiment, a method of constructing a cryogenics electronic device includes flip-chip bonding a semiconductor chip to a substrate. A plurality of bump bonds are arranged in a bump region of the semiconductor chip. A plurality of qubits are arranged in a predefined region of the semiconductor chip. The predefined region and the bump region are separate regions. One or more standoffs are arranged in a region of the semiconductor chip away from the bump region. The one or more standoffs separate the semiconductor chip and the substrate. The method provides a structure with reduced/prevented damage to the bonds caused by different coefficients of thermal expansion of the semiconductor chip and the substrate.

BRIEF DESCRIPTION OF THE DRAWINGS

The drawings are of illustrative embodiments. They do not illustrate all embodiments. Other embodiments may be used in addition to or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
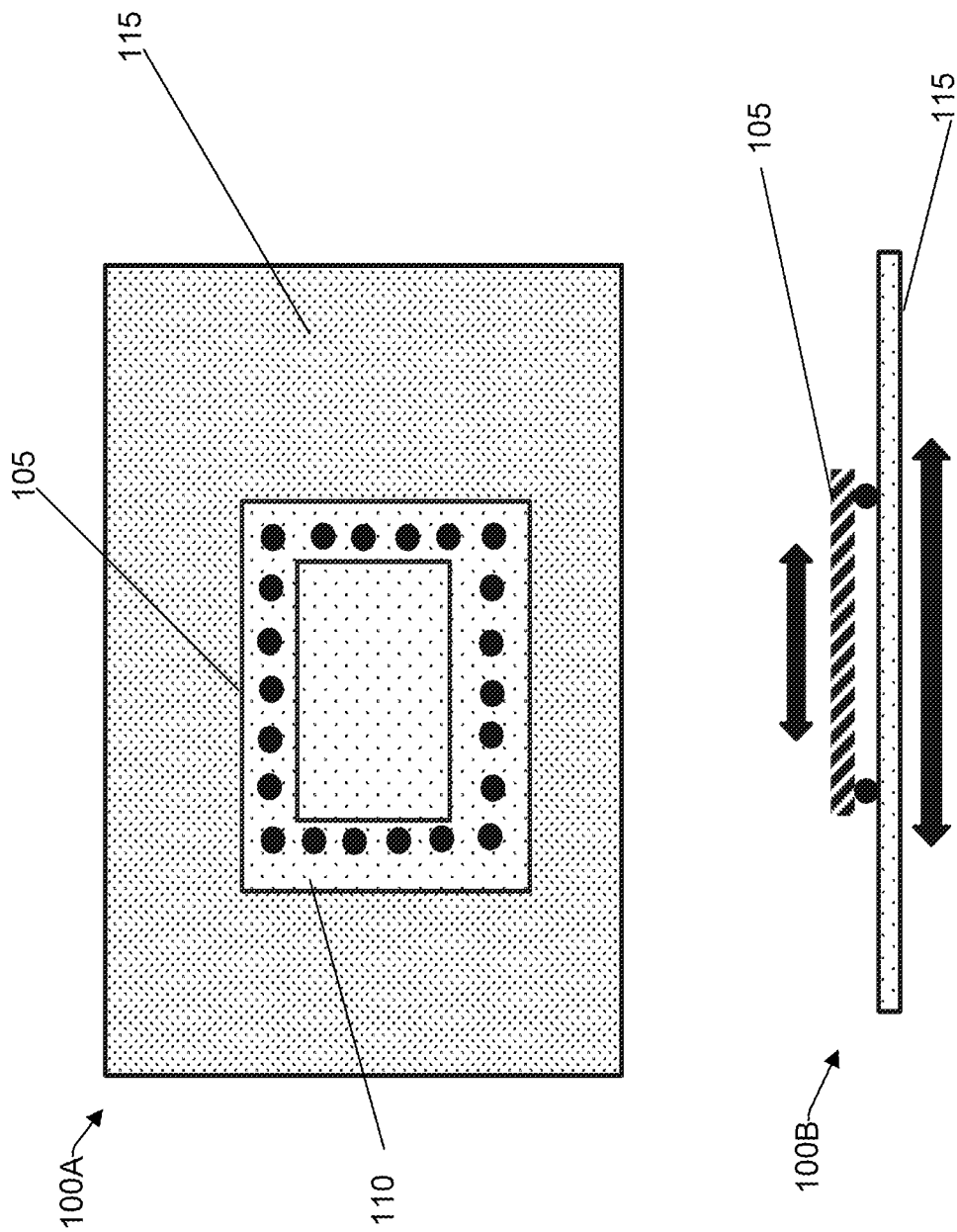
FIG. 1 illustrates a conventional flip chip structure in which solder bumps are arranged around a periphery of the chip.

In the following detailed description, numerous specific details are set forth by way of examples to provide a thorough understanding of the relevant teachings. However, it is to be understood that the present teachings may be practiced without such details. In other instances, well-known methods, procedures, components, and/or circuitry have been described at a relatively high level, without detail, to avoid unnecessarily obscuring aspects of the present teachings. It is also to be understood that the present disclosure is not limited to the depictions in the drawings, as there may be fewer elements or more elements than shown and described.

In discussing the present technology, it may be helpful to describe various salient terms. In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together. As used herein, the term "mechanically tolerant" relates to electrical properties not being significantly affected by the mechanical alignment between subject components. In addition, the term "base temperature" is defined as an operating temperature for the device in a cryogenic or sub-cryogenic range.

As used herein, certain terms are used indicating what may be considered an idealized behavior, such as "lossless," "superconductor," "superconducting," "absolute zero," which are intended to cover functionality that may not be exactly ideal but is within acceptable margins for a given application. For example, a certain level of loss or tolerance may be acceptable such that the resulting materials and structures may still be referred to by these "idealized" terms.

Although the terms first, second, third, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The present disclosure generally relates to flip chip bonded structure that can, for example, support connecting qubit devices in a modular way. Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

The ability to include more superconducting qubits is salient to being able to realize the potential of quantum computers. However, it is challenging to yield quantum processors on a monolithic qubit chip that have the desired qubit characteristics, such as frequency, fidelity, etc. A modular architecture constructed of smaller modular units of devices that are interconnected can make it more feasible to realize a large-scale quantum processor. However, such modular architecture may involve connections between qubits on separate physical chips and/or supporting circuitry for the qubit chip. Various quantum phenomena, such as superposition and entanglement, do not have analogs in the world of classical computing and therefore may involve special structures, techniques, and materials in order to assemble electronic devices that may operate in a cryogenic environment.

In one aspect, the teachings herein are based on the inventors' insight that directly applying conventional integrated circuit techniques for interacting with computing elements to superconducting quantum circuits may not be effective because of the unique challenges presented by quantum circuits that are not presented in classical computing architectures. Indeed, many of the systems and architectures discussed herein are operated in a cryogenic environment and may involve superconductivity. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for connecting components of a quantum computer. The techniques described herein may be implemented in a number of ways. Example implementations are provided below with reference to the following figures.

Example Architecture

FIG. 1 illustrates in 100A a top view of a conventional flip chip structure in which solder bumps 110 are arranged around a periphery of a chip 105, and in 100B, a side view of the flip chip structure. The chip 105 may be a qubit chip, but the present disclosure is not limited to qubit chips. The bumps 110 are concentrated in a portion of the chip 105 rather than being spread uniformly across the chip area. By concentrating the bump bonds in an area of the chip, the maximum stress induced by temperature excursion is reduced.

The chip 105 is bonded to a dissimilar material 115 (such as a printed circuit board, a laminate, or a flexible material) via the bumps 110. The chip 105 and the dissimilar material 115 have dissimilar thermal coefficients of expansion. When the structure is cooled to cryogenic temperatures for quantum computing operations, the difference in thermal expansion of the dissimilar materials can damage the connection of the bump bonds and cause a failure in operation of the chip 105. As the chip 105 and the dissimilar material 115 substrate and chip are thermally mismatched, there will be a stress on the bumps when undergoing a cooling cycle. Therefore, for a given bump metallurgy (including both the bump material as well as the under-bump metallurgy which binds the bump to the chip and substrate), there is a maximal amount of stress that can be tolerated before failure. This stress is due to the lateral distance between bumps combined with the CTE mismatch The flip-chip structure of FIG. 2 overcomes the problems caused by thermal expansion differences between the bonding of the chip 105 to the dissimilar material 115 in structures such as shown in FIG. 1. It is shown that the arrangement of the bumps 210 are concentrated in a solder region 225. By limiting a maximum distance between the bumps 210, the damage from CTE mismatch is reduced and/or overcome. The concentration of the bump bonds in one region of the chip reduce a maximum difference over which the differential contraction can act between a chip and the substrate. Additional features of the present disclosure are disclosed herein.

Example Embodiments

Figure 2:
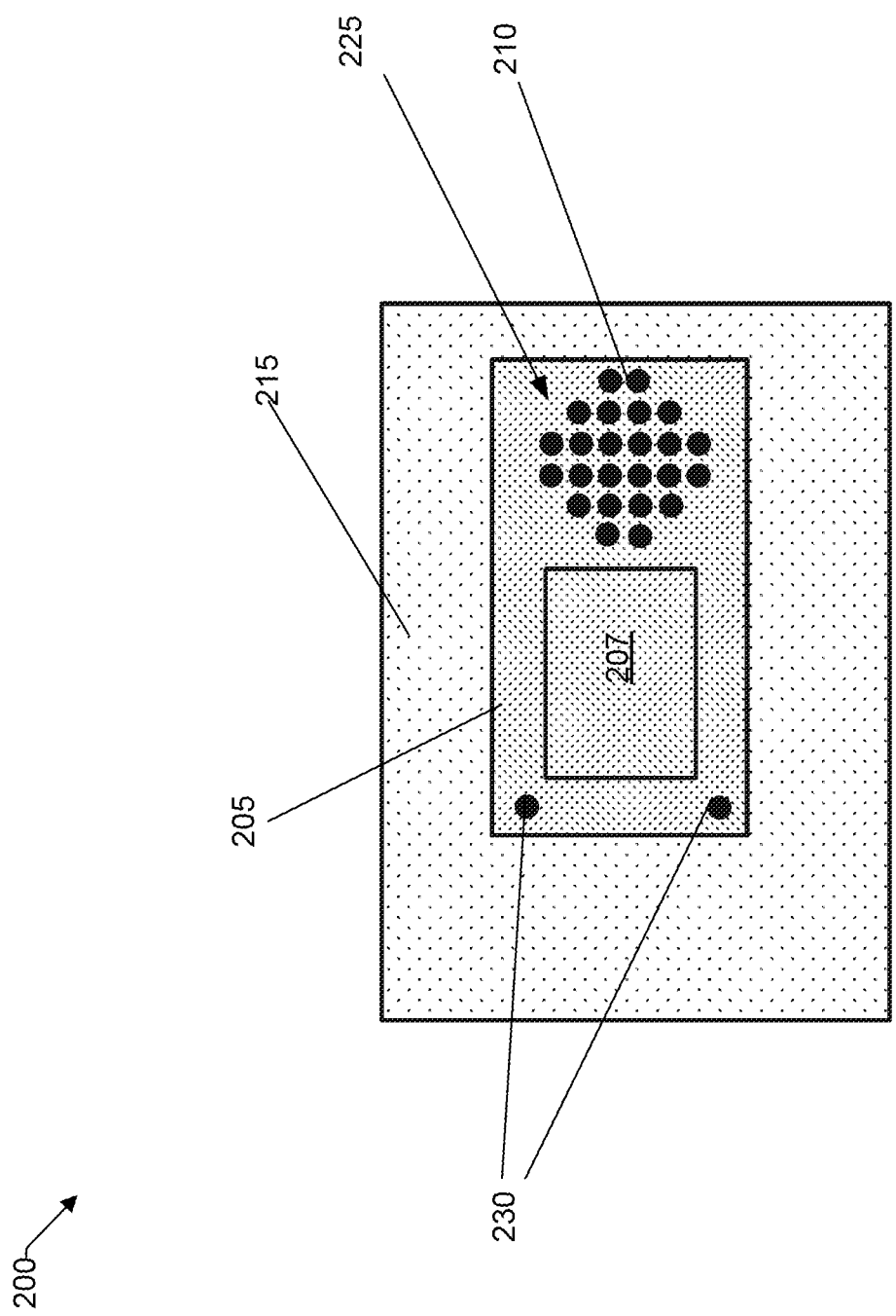
FIG. 2 illustrates a flip chip structure in which the solder bumps are arranged in a solder region, consistent with an illustrative embodiment.

FIG. 2 illustrates a flip chip structure 200 in which the solder bumps 210 are arranged in a solder region 225, consistent with an illustrative embodiment. The chip 205 is bonded to the substrate 215. The substrate 215 may be, for example, a PCB or laminate material that typically has a different coefficient of thermal expansion (CTE) than the chip 205.

Arranging the bumps 210 in one region (e.g., the solder region 225) of the chip reduces the maximum difference over which differential contraction can act between the chip 205 and substrate 215. A plurality of circuit elements may be arranged in a pre-defined region 207. The pre-defined region 207 may include qubits as some of the circuit elements, or have only qubits arranged therein. Standoffs 230 support other portions of chip 205 that do not have bumps. The standoffs 230 provide mechanical stability and the arrangement of standoffs 230 at the far end of the chip 205 prevent stresses caused by the chip 205 pushing down at the unsupported ends. These standoffs 230 may be a constructed of a small number of bumps (which would be sacrificial in that they could change shape or crack under thermal stress). Alternatively, the standoffs 230 may be non-bonding standoffs made by stud bumping, or standard CMOS techniques using reactive ion etching (RIE), additive techniques, etc.

Although FIG. 2 shows two standoffs 230, it is to be understood that there may be only one standoff, or more than the two standoffs 230 shown. The placement of the standoffs 230 are not limited to the positions shown, but are selected so that the arrangement of the chip 205 on the substrate 215 is substantially level. In an embodiment, the one or more standoffs separate the semiconductor chip and the substrate. The standoff may not be attached to both the semiconductor chip and substrate, and may serve to prevent contact from a tilting in the area that does not have bumps.

Figure 3:
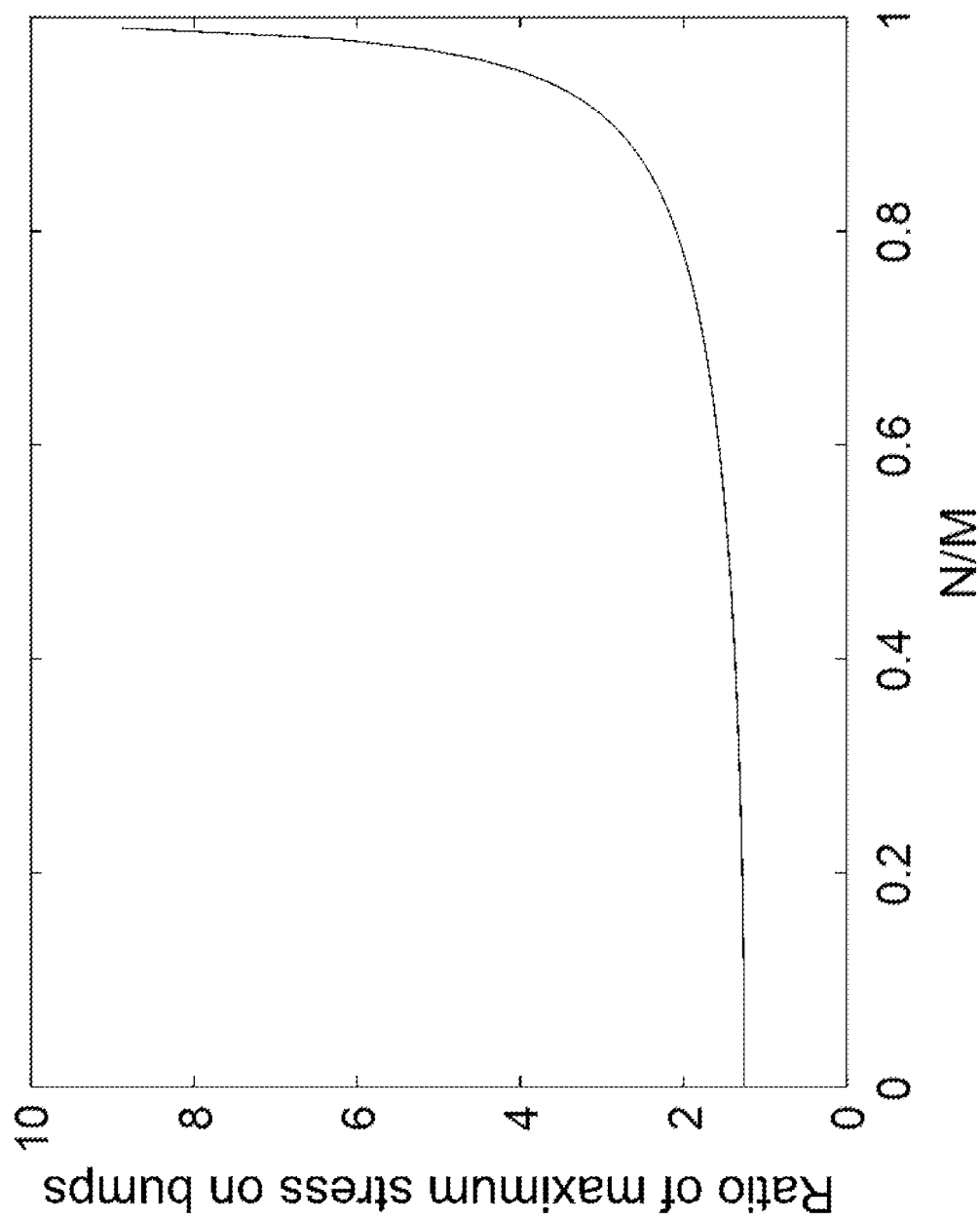
FIG. 3 is a graph illustrating a ratio of maximum stress on the bumps versus an area of the chip N and the area M along the periphery of N, consistent with an illustrative embodiment.

FIG. 3 illustrates is a graph illustrating a ratio of maximum stress on the bumps versus an area of the chip N and the area M along the periphery of N, consistent with an illustrative embodiment. The area for the bumps is then $M^2-N^2$. The largest spacing between bumps is $M/\sqrt{2}$ and the differential expansion will be $\Delta(CTE)*\sqrt{2}*M$ where $\Delta(CTE)$ is the total fractional change in dimension experienced over the range of temperatures experienced by the substrate.

In one embodiment, these bumps are collected into a circle of equal area. The maximum spacing of bumps is now $\sqrt{((M^2-N^2)/p)}$. The advantage offered in terms of expansion for a fixed number of bumps (i.e. bump area) can be provided by the ratio: $M*\sqrt{(p/2)}/\sqrt{(M^2-N^2)}=\sqrt{(p/2)}/\sqrt{(1-(N/M)^2)}$. For small or few bumps (e.g., N slightly less than M) the advantage is compelling.

In one embodiment (e.g., in a case typically experienced), N/M~0.8 and 2-fold improvement in the stress experienced may be expected, corresponding to a ~4-fold increase in the number of qubits while preserving the same stress (and therefore rate of failure) of the chip to substrate bond. Other geometries (such as bumps on only two sides) may provide more or less advantage but the general trend will be preserved if the most space-efficient arrangement for the bump bonds is used, which is a circular arrangement.

Figure 4:
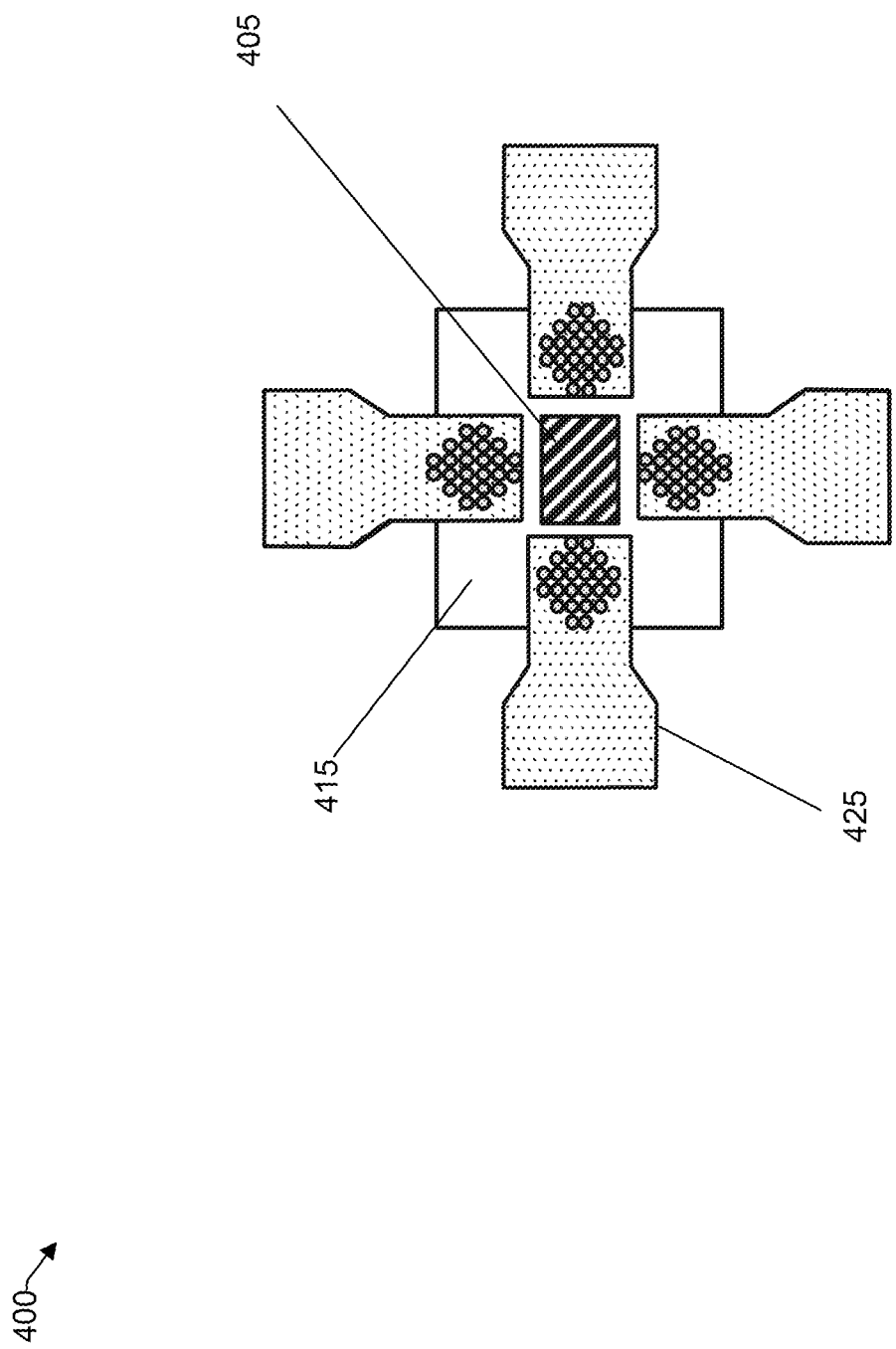
FIG. 4 illustrates multiple 'pigtail' connections to an inner chip which leads to other connections for wiring the inner chip, consistent with an illustrative embodiment.

FIG. 4 illustrates multiple substrate connections 425 to an inner chip 405 which can lead to other connections for wiring the inner chip, consistent with an illustrative embodiment. Instead of a single attachment, in this embodiment there are four substrates 425 attached at one per edge. In this case, the substrates 425 may be realized as 'pigtail' connections made of a rigid or a flexible material. In the case of a flexible material, it may be salient to have a rigid or at least stiffened backer on the substrates 425, which contacts the bumps arrays 410, for practical purposes of assembly. The inner chip 405 is the active portion of the chip, which in this example is a qubit chip. Element 415 is an interposer that may be used for additional connections. It may be advantageous for the remaining portion of the pigtail 425 to have a flexible construction to relieve any stress on the bump array 410 if the other end of the pigtail 425 is connected to wiring (not pictured in this drawing).

In the multiple-attachment case such as shown in FIG. 4, the chip size would be different than in the single array case discussed with regard to FIG. 2. The area of each individual patch would be ¼ of that in the previous example, and the ratio of stress to a conventional structure versus the arrangement shown in FIG. 4 would increase by an additional factor of 2. In addition, the number of qubits that can be included in the diagonally stripped region would also increase by a further factor of 4.

Further advantages may be obtained by using the corners of the chip 405 for additional substrates 425. Note that while the overall chip size increases when using the bump bond pattern such as shown in FIG. 4, the number of qubits which can be included is larger than known heretofore.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, operations, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any such actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A cryogenic electronics device, comprising:
   a semiconductor chip;
   a substrate flip-chip bonded to the semiconductor chip;
   a plurality of bump bonds concentrated in a bump region of the semiconductor chip; and
   a plurality of circuit elements arranged in a predefined region of the semiconductor chip, wherein:
      the predefined region and the bump region are separate regions; and
      the bump region is not surrounded by the circuit elements of the predefined region.

2. The cryogenic electronics device of claim 1, wherein the semiconductor chip has a coefficient of thermal expansion (CTE) that is different from a CTE of the substrate.

3. The cryogenic electronics device of claim 1, wherein:
   the plurality of circuit elements include qubits; and
   the semiconductor chip comprises a silicon chip.

4. The cryogenic electronics device of claim 3, wherein a number of qubits in the predefined region are capped.

5. The cryogenic electronics device of claim 1, further comprising one or more standoffs arranged in a region of the semiconductor chip that is away from the bump region.

6. The cryogenic electronics device of claim 5, wherein the one or more standoffs separate the semiconductor chip and the substrate.

7. The cryogenic electronics device of claim 1, wherein the substrate comprises a printed circuit board or a laminate structure, and wherein the substrate is differently-sized than the semiconductor chip.

8. The cryogenic electronics device of claim 1, wherein the bump region is substantially circular.

9. A cryogenic electronics device comprising:
   a first substrate;
   a second substrate joined to the first substrate;
   a plurality of bump bonds concentrated in a contiguous bump region of the first substrate; and
   a plurality of circuit elements in a predefined region of the first substrate separate from the bump region,
   wherein the bump region is not surrounded by the circuit elements of the predefined region.

10. The cryogenic electronics device of claim 9, wherein:
    the bump region comprises a plurality of substrates; and
    the predefined region is not located between any portion of the bump region.

11. The cryogenic electronics device of claim 9, wherein:
    the predefined region includes a plurality of qubits; and
    the plurality of bump bonds in the bump region of the first substrate is configured to provide a signal to the plurality of qubits.

12. The cryogenic electronics device of claim 11, wherein the bump region comprises an area of the first substrate that excludes the plurality of qubits.

13. The cryogenic electronics device of claim 12, wherein the bump region comprises an area of the first substrate that includes bump bonds and signal lines.

14. The cryogenic electronics device of claim 12, wherein the bump region comprises an area of the first substrate that excludes circuit elements.

15. The cryogenic electronics device of claim 9, wherein:
    the bump region is packed to maximize a density of the bumps; and
    signals from the bumps are carried through one or more subsurface interconnect levels.

16. The cryogenic electronics device of claim 9, further comprising a numerical design criterion comprising at least one of:
    including greater than a number (n) of bumps arranged in an area less than x; and/or
    including a density of at least n bumps/area.

17. The cryogenic electronics device of claim 9, wherein a thermal contraction of the bump region is defined as a relative value comprising at least one of:
    the thermal contraction of the bump region experiences less than a percentage x of a thermal contraction of the first substrate;
    the thermal contraction of the bump region experiences less thermal contraction than a different predefined region;
    the thermal contraction of the bump region has a predetermined expansion between the first substrate and the second substrate; and/or
    the bumps are arranged to be within x % of the minimum CTE mismatch for thermal excursion from room temperature to base temperature.

18. The cryogenic electronics device of claim 9, further comprising a plurality of substrate connectors, wherein:
    each substrate connector is respectively connected to a portion of the bump region; and
    at least some nodes of the substrate connectors are wired to the first substrate.

19. The cryogenic electronics device of claim 18, wherein:
    the plurality of substrate connectors comprises four; and
    a stiffened backer is arranged to support the substrate connectors.

20. A method of constructing a cryogenics electronic device, comprising:
    flip-chip bonding a semiconductor chip to a substrate;
    arranging a plurality of bump bonds in a bump region of the semiconductor chip;
    arranging a plurality of qubits in a predefined region of the semiconductor chip, wherein:
       the predefined region and the bump region are separate regions; and
       the bump region is not surrounded by the plurality of qubits of the predefined region; and
    arranging one or more standoffs in a region of the semiconductor chip away from the bump region such that the one or more standoffs separates the semiconductor chip and the substrate.

\* \* \* \* \*